US 7,525,094 B2

United States Patent
Cooke et al.

(10) Patent No.: US 7,525,094 B2
(45) Date of Patent: Apr. 28, 2009

(54) NANOCOMPOSITE SCINTILLATOR, DETECTOR, AND METHOD

(75) Inventors: D. Wayne Cooke, Santa Fe, NM (US); Edward A. McKigney, Los Alamos, NM (US); Ross E. Muenchausen, Los Alamos, NM (US); Bryan L. Bennett, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 0 days.

(21) Appl. No.: 11/644,246

(22) Filed: Dec. 21, 2006

(65) Prior Publication Data

US 2008/0093557 A1 Apr. 24, 2008

Related U.S. Application Data

(60) Provisional application No. 60/752,981, filed on Dec. 21, 2005.

(51) Int. Cl.
*G01T 1/20* (2006.01)
(52) U.S. Cl. .................................. 250/361 R
(58) Field of Classification Search ............... 250/361 R
See application file for complete search history.

(56) References Cited

U.S. PATENT DOCUMENTS

| | | | |
|---|---|---|---|
| 4,230,510 A | 10/1980 | Cusano et al. | |
| 4,362,946 A | 12/1982 | Cusano et al. | |
| 4,647,781 A | 3/1987 | Takagi et al. | |
| 4,692,266 A | 9/1987 | Costa et al. | |
| 4,958,080 A | 9/1990 | Melcher | |
| 5,264,154 A | 11/1993 | Akiyama et al. | |
| 5,952,665 A | 9/1999 | Bhargava | |
| 6,207,077 B1 | 3/2001 | Burnell-Jones | |
| 6,323,489 B1 | 11/2001 | McClellan | |
| 6,448,566 B1 | 9/2002 | Riedner et al. | |
| 6,452,184 B1 | 9/2002 | Taskar et al. | |
| 6,565,973 B2 * | 5/2003 | Duff et al. .................. 428/402 |
| 6,599,444 B2 | 7/2003 | Burnell-Jones | |
| 6,689,293 B2 | 2/2004 | McClellan et al. | |
| 6,699,406 B2 | 3/2004 | Riman et al. | |
| 6,734,465 B1 | 5/2004 | Taskar et al. | |
| 7,094,361 B2 | 8/2006 | Riman et al. | |
| 7,145,149 B2 | 12/2006 | Cooke et al. | |
| 2004/0174917 A1 | 9/2004 | Riman et al. | |
| 2006/0231797 A1 | 10/2006 | Riman et al. | |

OTHER PUBLICATIONS

Shah et al., "CeBr3 Scintillators for Gamma-Ray Spectroscopy," IEEE Transactions on Nuclear Science, vol. 52, No. 6, Dec. 2005, pp. 3157-3159.*

Glodo et al., "Thermoluminescence of LaBr3:Ce and LaCl3:Ce crystals." Nuclear Instruments and Methods in Physics Research A 537 (2005) pp. 93-96.*

(Continued)

*Primary Examiner*—Constantine Hannaher
(74) *Attorney, Agent, or Firm*—Samuel L. Borkowsky

(57) ABSTRACT

A compact includes a mixture of a solid binder and at least one nanopowder phosphor chosen from yttrium oxide, yttrium tantalate, barium fluoride, cesium fluoride, bismuth germanate, zinc gallate, calcium magnesium pyrosilicate, calcium molybdate, calcium chlorovanadate, barium titanium pyrophosphate, a metal tungstate, a cerium doped nanophosphor, a bismuth doped nanophosphor, a lead doped nanophosphor, a thallium doped sodium iodide, a doped cesium iodide, a rare earth doped pyrosilicate, or a lanthanide halide. The compact can be used in a radiation detector for detecting ionizing radiation.

31 Claims, 3 Drawing Sheets

OTHER PUBLICATIONS

Sehgal et al., "Precipitation-Redispersion of Cerium Oxide Nanoparticles with Poly(acrylic acid): Toward Stable Disperions," Langmuir, vol. 21, Sep. 2005, pp. 9359-9364.

Pandey et al., "A Study of Optical Parameters of Amorphous $Se_{70}Te_{30-x}Ag_x$ Thin Films Before and After Heat Treatment," Journal of Ovonic Research, vol. 3, No. 2, Apr. 2007, pp. 29-38.

Chander, "Development of Nanophosphors—A Review," Materials Science and Engineering R, vol. 49, issue 5, Jun. 2005, pp. 113-155.

Tong et al., Preparation of Alumina by Aqueous Gelcasting, Ceramic Inter., vol. 30, Oct. 2004, pp. 2061-2066.

Inkyo et al., Kotubuki Industries, "Dispersion of Agglomerated Nanoparticles by Micromedia Mill, Ultra Apex Mill," J. Soc. Powder Tech. Jap., vol. 41, May 2004, pp. 1-11.

Khan et al., "Interaction of Binders with Dispersant Stabilised Alumina Suspensions," Colloids and Surfaces A: Physicochemical and Engineering Aspects, vol. 161, 2000, pp. 243-257.

Shoudu et al., "Czochralski Growth of Rare-Earth Orthosilicates—$Y_2SiO_5$ Single Crystals," Journal of Crystal Growth, vol. 197, Mar. 1999, pp. 901-904.

Rodnyi, "Physical Process in Inorganic Scintillators," CRC Press, 1997, p. 50.

Loutts et al., "Czochralski Growth and Characterization of $(Lu_{1-x}Gd_x)_2SiO_5$ Single Crystals for Scintillators," Journal of Crystal Growth, vol. 174, Apr. 1997, pp. 331-336.

Melcher et al., "Czochralski Growth or Rare Earth Oxyorthosilicate Single Crystals," Journal of Crystal Growth, vol. 128, Mar. 1993, pp. 1001-1005.

Shmulovich et al., "Single-Crystal Rare-Earth-Doped Yttrium Orthosilicate Phosphors," J. Electrochemical Society: Solid State Science and Technology, vol. 135, No. 12, Dec. 1988, pp. 3141-3151.

Brandle et al., "Czochralski Growth of Rare-Earth Orthosilicates $(Ln_2SiO_5)$," Journal of Crystal Growth, vol. 79, Dec. 1986, pp. 308-315.

* cited by examiner (a) (b) (c)

NANOCOMPOSITE SCINTILLATOR, DETECTOR, AND METHOD

RELATED APPLICATIONS

This application claims the benefit of U.S. Provisional Patent Application Ser. No. 60/752,981 filed Dec. 21, 2005, hereby incorporated by reference.

STATEMENT REGARDING FEDERAL RIGHTS

This invention was made with government support under Contract No. DE-AC51-06NA25396 awarded by the U.S. Department of Energy. The government has certain rights in the invention.

BACKGROUND

Phosphors are currently used in many important devices such as fluorescent lamps, RGB (red, green, blue) screens, lasers, and crystal scintillators for radiation detectors, radiographic imaging and nuclear spectroscopy. Perhaps the most important property of any phosphor is its brightness, i.e. its quantum efficiency, which is the ratio of the number of photons emitted by the phosphor to the number of photons absorbed. Other important properties include the spectral region of maximum emission (which should match commonly-used photodetectors), optical absorption (minimum self-absorption is desired), decay time of the emission (for some applications fast is desired), and the density. Additionally, phosphors may be categorized as either intrinsic, when the luminescence originates from the host material, or extrinsic, when impurities or dopants in the host material give rise to the luminescence.

In general, superior scintillators exhibit high quantum efficiency, good linearity of the spectral emission with respect to incident energy, high density, fast decay time, minimal self-absorption, and high effective Z-number (the probability of photoelectric absorption is approximately proportional to $Z^5$). Specific scintillator applications determine the choice of phosphor. For example, scintillators used for active and passive radiation detection require high density, and brightness, whereas scintillators used for radiographic imaging also require fast decay time.

An exceptionally good scintillator is cerium-activated lutetium oxyorthosilicate. This material has been conveniently abbreviated in the art as either LSO:Ce or Ce:LSO. LSO:Ce is a crystalline solid that includes a host lattice of lutetium oxyorthosilicate ($Lu_2SiO_5$, abbreviated LSO) that is activated by a small amount of the rare-earth metal dopant cerium (Ce). Cerium is an excellent activator because both its 4f ground and 5d excited states lie within the band gap of about 6 eV of the host LSO lattice. LSO:Ce is very bright, i.e. it has a very high quantum efficiency. LSO:Ce also has a high density (7.4 gm/cm$^3$), a fast decay time (about 40 nanoseconds), a band emission maximum near 420 nanometers, and minimal self-absorption.

Oxyorthosilicate scintillators, including LSO:Ce, have been documented in the following reports and patents.

"Czochralski Growth of Rare-Earth Orthosilicates ($Ln_2SiO_5$)" by Brandle et al (Journal of Crystal Growth, vol. 79, p. 308-315, 1986), incorporated by reference herein, describes yttrium oxyorthosilicate (YSO) activated with Ce, Pr, Nd, Sm, Gd, Tb, Er, Tm, or Yb.

"Single-Crystal Rare-Earth doped Yttrium Orthosilicate Phosphors" by Shmulovich et al. (Journal of the Electrochemical. Society:Solid-State Science and Technology, vol. 135, no. 12, p. 3141-3151, 1988), incorporated by reference herein, describes single crystals of rare-earth activated YSO (prepared according to aforementioned Brandle et al.) that include a green phosphor containing YSO activated with Tb and Gd, and a red phosphor containing YSO activated with Tb and Eu.

"Czochralski Growth of Rare Earth Oxyorthosilicate Single Crystals" by Melcher et al. (Journal of Crystal Growth, vol. 128, p. 1001-1005, 1993), incorporated by reference herein, describes the Czochralski preparation of single crystals of GSO:Ce, LSO:Ce, and YSO:Ce.

"Czochralski Growth and Characterization of $(Lu_{1-x}Gd_x)_2SiO_5$" by Loutts et al. (Journal of Crystal Growth, vol. 174, p. 331-336, 1997), incorporated by reference herein, describes the preparation and properties of single crystals of cerium-activated oxyorthosilicates having a crystal lattice of lutetium and gadolinium.

U.S. Pat. No. 4,647,781 to Takagi et al. entitled "Gamma Ray Detector," which issued on Mar. 3, 1987, incorporated by reference herein, describes a cerium-activated oxyorthosilicate scintillator having the general formula $Gd_{2(1-x-y)}Ln_{2x}Ce_{2y}SiO_5$ wherein Ln is yttrium and/or lanthanum, wherein $0 \leq x \leq 0.5$, and wherein $1 \times 10^{-3} \leq y \leq 0.1$.

U.S. Pat. No. 4,958,080 to Melcher entitled "Lutetium Orthosilicate Single Crystal Scintillator Detector," which issued on Sep. 18, 1990, describes an x-ray detector employing a transparent, single crystal of cerium-activated lutetium oxyorthosilicate (LSO:Ce).

U.S. Pat. No. 5,264,154 to Akiyama et al. entitled "Single Crystal Scintillator," which issued on Nov. 23, 1993, incorporated by reference herein, describes a single crystal cerium-activated oxyorthosilicate scintillator having the general formula $Gd_{2-(x+y)}Ln_xCe_ySiO_5$ wherein Ln is Sc, Tb, Lu, Dy, Ho, Er, Tm, or Yb, wherein $0.03 \leq x \leq 1.9$, and wherein $0.001 \leq y \leq 0.2$.

U.S. Pat. No. 6,689,298 to McClellan et al. entitled "Crystalline Rare-Earth Activated Oxyorthosilicate Phosphor," which issued on Feb. 10, 2004, incorporated by reference herein, describes a variety of single crystal phosphors such as lutetium yttrium phosphor (host lattice LYSO), lutetium gadolinium phosphor (host lattice LGSO), and gadolinium yttrium phosphor (host lattice GYSO) that have been doped with rare earth dopants Sm, Tb, Tm, Eu, Yb, and Pr.

Other exceptionally good scintillators include rare earth doped lanthanum halides, such as cerium doped lanthanum fluoride, cerium doped lanthanum chloride, cerium doped lanthanum bromide, and cerium doped lanthanum mixed halides.

While the scintillator properties of LSO:Ce are exceptional, high-quality single crystals are difficult and expensive to prepare. The high cost, which is at least partly due to the high cost of starting materials (high purity $Lu_2O_3$ powder) and equipment (iridium crucibles for containing the $Lu_2O_3$ powder that melts at about 2150 degrees Celsius), and the tendency of the crystal boule to form cracks that limit the amount of usable single crystal from the boule, limits efforts to develop other types of crystals with an LSO host lattice.

High Purity Germanium (HPGe) detectors allow for the resolution of closely spaced peaks in a gamma-ray energy spectrum, and at this level of resolution each element has a distinctive spectrum. The number of gamma rays observed is proportional to the product of the total detector efficiency and the counting time. If counting time is limited, large detector mass is needed to achieve good statistical accuracy.

A large, inexpensive, ambient temperature gamma-ray detector with the energy resolution of current HPGe detectors would greatly simplify the task of finding and identifying the isotopic composition of radiation sources.

BRIEF SUMMARY OF THE INVENTION

Briefly, the present invention provides a compact that includes a mixture of a solid binder and at least one nanopowder phosphor chosen from yttrium oxide, yttrium tantalate, barium fluoride, cesium fluoride, bismuth germanate, zinc gallate, calcium magnesium pyrosilicate, calcium molybdate, calcium chlorovanadate, barium titanium pyrophosphate, a metal tungstate, a cerium doped nanophosphor, a bismuth doped nanophosphor, a lead doped nanophosphor, a thallium doped sodium iodide, a doped cesium iodide, a rare earth doped pyrosilicate, or a lanthanide halide The invention also includes a radiation detection method. The method includes exposing a compact to ionizing radiation, wherein the compact comprises a mixture of a solid binder and at least one nanopowder phosphor chosen from yttrium oxide, yttrium tantalate, barium fluoride, cesium fluoride, bismuth germanate, zinc gallate, calcium magnesium pyrosilicate, calcium molybdate, calcium chlorovanadate, barium titanium pyrophosphate, a metal tungstate, a cerium doped nanophosphor, a bismuth doped nanophosphor, a lead doped nanophosphor, a thallium doped sodium iodide, a doped cesium iodide, a rare earth doped pyrosilicate, or a lanthanide halide; and detecting luminescence from the compact.

The invention also provides a radiation detector. The radiation detector includes a compact optically coupled to a photodetector. The compact includes a mixture of a solid binder and at least one nanopowder phosphor chosen from yttrium oxide, yttrium tantalate, barium fluoride, cesium fluoride, bismuth germanate, zinc gallate, calcium magnesium pyrosilicate, calcium molybdate, calcium chlorovanadate, barium titanium pyrophosphate, a metal tungstate, a cerium doped nanophosphor, a bismuth doped nanophosphor, a lead doped nanophosphor, a thallium doped sodium iodide, a doped cesium iodide, a rare earth doped pyrosilicate, or a lanthanide halide.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION

Figure 1:
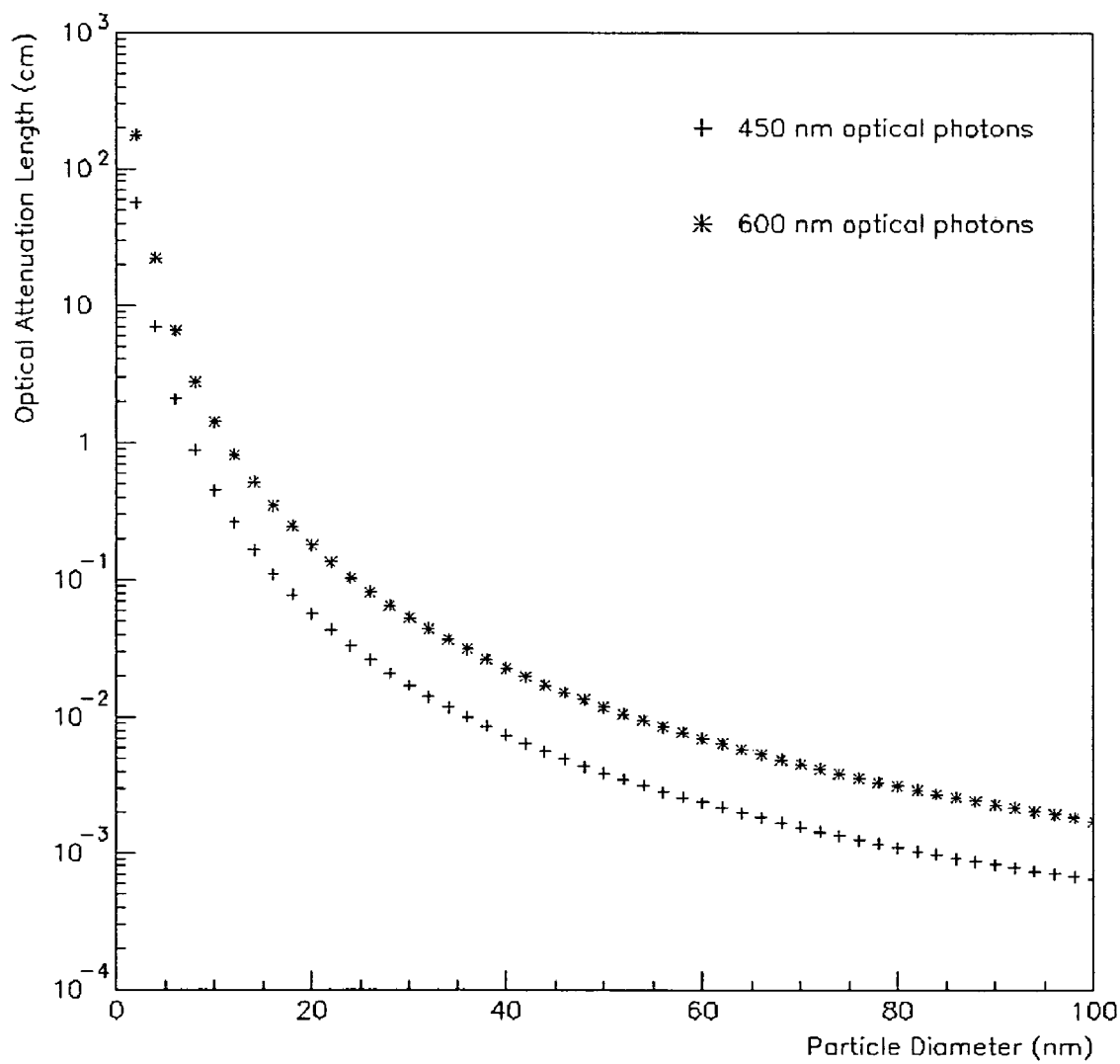
FIG. 1 shows a plot of the optical attenuation length calculated for an embodiment nanocomposite where the index of refraction of the matrix (i.e. the binder) is similar to that of polystyrene (1.59) and the index of refraction of the phosphor is approximately that of the rare earth oxyorthosilicates (1.80). The x-axis indicates the size of particles in nanometers and the y-axis indicates the optical attenuation length in centimeters. The asterisk (*) represent 600 nm optical photons and the plus sign (+) represent 450 nm optical photons. The calculation was performed using software from Mishchenko et al., "Scattering, Absorption, and Emission of Light by Small Particles," Cambridge University Press, Cambridge (2002).

The invention is concerned with nanocomposite scintillators and with a detector that employs nanocomposite scintillators and that can detect photons (x-rays and gamma rays, for example) and/or particles (protons and neutrons, for example). Scintillators are phosphors that convert ionizing radiation to a light output in the UV-visible and/or infrared. The nanocomposite scintillator is prepared using nanopowders of fast, bright, dense scintillators. The brightness provides an invention detector with optimum light detection, and the high density provides the detector with stopping power for the x-rays, gamma-rays, neutrons, protons, or the like. Also, the cost of preparing nanocomposite scintillator of the invention is inexpensive compared to the cost of preparing single crystals.

Embodiment nanocomposites may be prepared by mixing nanopowder phosphor with a polymer or glass binder. Nanopowder is defined herein as powder with particle sizes of 100 nanometers or less. The binder, which is sometimes referred to herein as the matrix, is usually substantially transparent to light emission from the nanopowder phosphor. The thickness of the nanocomposite is easily controllable and can be adjusted depending on the particular application.

Some matrix materials may have an index of refraction that closely matches the index of refraction of the phosphor and is transparent to the wavelength of emission of the phosphor. Additionally, a matrix material may also be scintillator, thereby providing light from the energy deposited into it.

Embodiment nanopowder phosphors may be intrinsic phosphors or extrinsic phosphors. Intrinsic phosphors are phosphors that do not include a dopant in order to produce luminescence. Extrinsic phosphors include a dopant to produce luminescence. Some non-limiting examples of intrinsic phosphors include yttrium oxide, yttrium tantalate, barium fluoride, cesium fluoride, bismuth germanate, zinc gallate, calcium magnesium pyrosilicate, calcium molybdate, calcium chlorovanadate, barium titanium pyrophosphate, a metal tungstate, and lanthanide halides. Some non-limiting examples of extrinsic phosphors include cerium doped nanophosphors, bismuth doped nanophosphors, lead doped nanophosphors, thallium doped sodium iodide, doped cesium iodide, and rare earth doped pyrosilicates.

Some embodiment host oxyorthosilicate lattices include lutetium oxyorthosilicate (LSO), gadolinium oxyorthosilicate (GSO), yttrium oxyorthosilicate (YSO), lutetium yttrium oxyorthosilicate (LYSO), gadolinium yttrium oxyorthosilicate (GYSO), lutetium gadolinium oxyorthosilicate (LGSO), lanthanum fluoride, lanthanum chloride, and lanthanum bromide. Some embodiment dopants with these host lattices include Ce, Sm, Tb, Tm, Eu, Yb, and Pr. Mixtures of these dopants into a host lattice can also be used.

Some examples of cerium doped nanophosphors include, but are not limited to, cerium doped oxyorthosilicates and lanthanum halide compounds of the formula $MX_3$:Ce wherein M is a lanthanide chosen from lanthanum, yttrium, cerium, praseodymium, neodymium, promethium, samarium, europium, gadolinium, terbium, dysprosium, holmium, erbium, thulium, ytterbium, and lutetium, and X is at least one halide chosen from fluoride, chloride, bromide, and iodide. In this compound and in those that follow, when it is mentioned that X is at least one halide, it should understood that mixed halide compounds are also included. For example, for the lanthanide halides of the formula $LaX_3$:Ce include cerium doped $LaBr_3$, $LaCl_3$, $LaF_3$, and $LaI_3$, and also materials such as but not limited to $LaBr_{1.5}Cl_{1.5}$ and $LaBr_{0.5}Cl_{0.5}I_1$. Other examples include cerium doped lanthanum halosilicate of a formula $LaSiO_3X$:Ce wherein X is at least one halide chosen from fluoride, chloride, bromide, and iodide; an alkaline earth fluoride of a formula $MF_2$:Ce wherein M is at least one alkaline earth chosen from barium, calcium, strontium and magnesium; an alkaline earth sulfate of a formula $MSO_4$:Ce wherein M is at least one alkaline earth chosen from barium, calcium, and strontium; an alkaline earth thiogallate of a formula $MGa_2S_4$:Ce wherein M is at least one alkaline earth chosen from barium, calcium, strontium and magnesium; alkaline earth aluminates of a formula $LMAl_{10}O_{17}$:Ce and $CeLMAl_{11}O_{18}$:Ce wherein L, M are at least two alkaline earth chosen from barium, calcium, strontium and magnesium; alkaline earth pyrosilicates of a formula $L_2MSi_2O_7$:Ce wherein L, M are at least two alkaline earth chosen from calcium, and magnesium; cerium doped metal aluminum perovskites of the formula $MAlO_3$:Ce wherein M is at least one metal chosen from yttrium and lutetium; cerium doped alkaline earth sulfides of formula MS:Ce wherein M is at least one alkaline earth chosen from strontium and magnesium; cerium doped yttrium borate; cerium doped yttrium aluminum borate; cerium doped yttrium aluminum garnets; cerium doped yttrium oxychlorides; cerium doped calcium silicates; cerium doped calcium aluminum silicates; cerium doped yttrium phosphates; cerium doped calcium aluminates; cerium doped calcium pyroaluminates; cerium doped calcium phosphates; cerium doped calcium pyrophosphates; and cerium doped lanthanum phosphates.

Some non-limiting examples of bismuth doped nanophosphors include a host lattice chosen from an alkaline earth phosphate of a formula $LM_2(PO_4)_2$:Bi wherein M is at least one alkaline earth chosen from barium, calcium, and strontium; lanthanide metal oxides of a formula $M_2O_3$:Bi wherein M is at least one metal chosen from yttrium and lanthanum; bismuth doped yttrium aluminum borates; bismuth doped lanthanum oxychlorides; bismuth doped zinc oxides; bismuth doped calcium oxides; bismuth doped calcium titanium aluminates; bismuth doped calcium sulfides; bismuth doped strontium sulfates and bismuth doped gadolinium niobates.

Some non-limiting examples of lead doped nanophosphors include alkaline earth sulfates of formula $MSO_4$:Pb wherein M is at least one alkaline earth chosen from calcium and magnesium; alkaline earth borates of formula $MB_4O_7$:Pb and $MB_2O_4$:Pb wherein M is at least one alkaline earth chosen from calcium and strontium; alkaline earth chloroborates of a formula $M_2B_5O_9Ci$:Pb wherein M is at least one alkaline earth chosen from barium, calcium, and strontium; lead doped barium oxyorthosilicates; lead doped calcium oxides; lead doped calcium sulfides; lead doped zinc sulfides; lead doped lanthanum oxides; lead doped calcium silicates; lead doped calcium tungstates; lead doped barium oxyorthosilicates; lead doped calcium chlorosilicates; lead doped calcium phosphates; and lead doped calcium thiogallates.

Some non-limiting examples of doped cesium iodide include a dopant chosen from Na and Tl.

Some non-limiting examples of rare earth doped pyrosilicates include a rare earth dopant chosen from Ce, Sm, Tb, Tm, Eu, Yb, and Pr.

Some embodiment nanopowder phosphors include rare earth doped oxyorthosilicates (e.g. $Y_2SiO_5$:RE, $Lu_2SiO_5$:RE and $Gd_2SiO_5$:RE and mixtures thereof, where RE indicates rare earth dopant, such as Ce or Sm) and rare earth doped lanthanum halides (e.g. $LaF_3$:RE, $LaCl_3$:RE and $LaBr_3$:RE and mixtures thereof).

The effective density of a scintillator may be adjusted by altering the amount of the nanopowder phosphor used. Embodiments may include an amount of nanopowder phosphor in a range of from greater than about zero volume percent to about 65 volume percent. Embodiments may include an amount of nanopowder phosphor greater than about 1 percent by volume, or greater than about 5 percent by volume, or greater than about 10 percent by volume, or greater than about 15 percent or by volume, or greater than about 20 percent or by volume, or greater than about 25 percent or by volume, or greater than about 30 percent or by volume, or greater than about 35 percent by volume, or greater than about 40 percent by volume, or greater than about 45 percent by volume, or greater than about 50 percent by volume, or greater than about 55 percent by volume, or greater than about 60 percent by volume.

Embodiment nanocomposite scintillators of the invention may be prepared in a wide variety of shapes using known processing techniques commonly used for preparing films, coatings, tubes, rods, fibers, and other structures. Nanocomposite scintillators of the invention can be made very large. Importantly, the nanocomposite scintillator can be tailored to emit light in a spectral region that matches the optimum response of photomultipliers (about 400 nanometers) or photodiodes (about 550 nanometers), which maximizes the overall efficiency of the radiation detector (which includes the typical detector elements such as power supplies, current meters, photomultiplier tubes, photodiodes, etc.).

Nanopowder phosphors used with some embodiments may be prepared by one or more chemical methods. Producing nanopowder by a chemical method is likely less expensive than by grinding down single crystals into powder. In addition, the particle size, surface characteristics, core-shell structure, dopant concentration and matrix material can be controlled more easily using chemical methods.

Nanopowder phosphor used with some embodiments has particle sizes of less than about 100 nanometers. Nanopowder phosphor used with other embodiments has particle sizes less than 50 nanometers. Nanopowder phosphor used with yet other embodiments has particle sizes less than 20 nanometers. Other embodiments may employ nanopowder phosphor having particle sizes less than 10 nanometer.

Nanopowder phosphor used with other embodiments has particle sizes of 5 nanometers or less.

Nanopowder phosphor may also be prepared by slurry ball milling of bulk scintillator powder, whereby the diluent contains a surfactant to prevent agglomeration of the milled nanoparticles and afterward centrifuging or sedimentation is used to separate out the desired fraction of nanoparticles.

Some embodiment compacts of the invention combines the high stopping power and photoelectric cross section of inorganic crystalline scintillators with the processing costs of plastic scintillators.

Improved light output and transport are expected for nanocomposites prepared from nanopowder phosphors of a particle size less than 20 nanometers (nm). FIG. 1 shows the calculated optical attenuation length for a nanocomposite scintillator of the invention. For this material, the index of refraction of the matrix is similar to that of polystyrene (1.59) and the index of refraction of the phosphor is approximately that of the rare earth oxyorthosilicates (1.80).

It should be noted that for nanopowders having a 5 nm particle size, and for 600 nm photon wavelengths, the optical attenuation length is approximately 20 cm. The attenuation length is the distance through which the incident light intensity will be reduced to 1/e or 37% of the initial value. The attenuation length takes into account both optical absorption and scattering losses. For a closer match of the indices of refraction between the phosphor and matrix, this attenuation length will become longer.

If the indices are exactly, or nearly, matched, attenuation from optical scattering will become negligible. A nanocomposite scintillator of cerium doped lanthanum fluoride ($LaF_3$: Ce), which has an index of refraction of about 1.65, and poly(p-xylylene), known as parylene which has an index of refraction between 1.639-1.669 and a visible light transmission of 90% is an example of such a nanocomposite.

It may be possible for the other scintillators mentioned if the matrix used is a high index of refraction optical quality glass. For example, matrix materials such as rare-earth flint glasses (Pb containing) have indices of refraction between 1.70 and 1.84 and lanthanum flint glasses vary between 1.82 and 1.98 depending on the glass composition.

Figure 2:
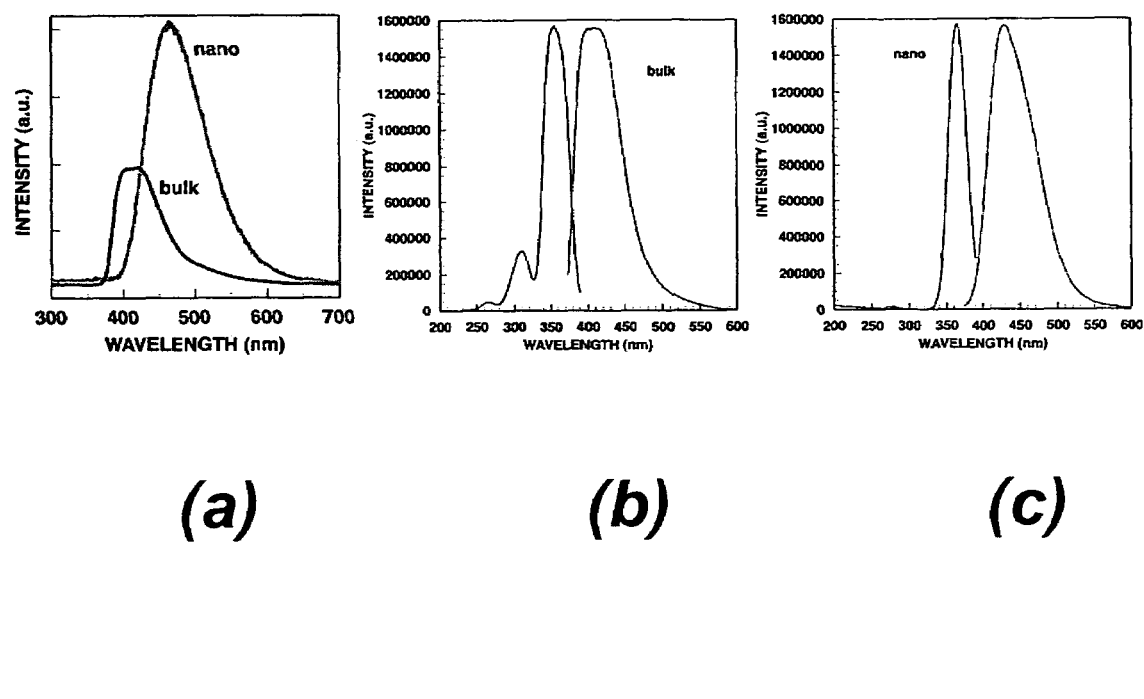
FIG. 2a shows a plot of the measured optical emission as a function of wavelength for powder excited by x-rays. The nanopowder emission is more intense and shifted compared to the bulk powder.
FIG. 2b shows a plot of the measured absorption (left) and emission (right) for bulk powder.
FIG. 2c shows a plot of the measured absorption (left) and emission (right) for nanopowder. The overlap of the absorption and emission curves for the nanopowder is less than for the bulk powder, which will result in longer optical attenuation length for nanophosphor composites compared to bulk phosphor composites. This effect is in addition to the longer attenuation length achieved by reduced optical scattering. The additional light output of the nanopowder will contribute to better energy resolution than would be achieved with the bulk powder.

FIG. 2a shows a plot of measured light output as a function of wavelength for bulk powder and nanopowdered $Y_2SiO_5$: Ce, FIG. 2b shows a plot of the measured light output as a function of wavelength for bulk powder, and FIG. 2c show a similar plot for the nanopowder. According to FIG. 2a-c, the light output of the nanopowdered material is about a factor of three higher than for the bulk powder. Also, the emission spectrum is shifted to longer wavelength, and the measured Stokes' shift is greater for the nanopowder than for the bulk powder. The Stokes' shift is the difference between the absorption spectrum and emission spectrum of a material, and a larger value for the Stokes' shift indicates a reduced self-absorption and, therefore, an enhanced light output and longer optical attenuation length, which are favorable for scintillator applications.

Embodiment nanocomposite scintillators may be prepared by, for example, dispersing nanopowder phosphor in a matrix material, or by hot pressing or other mechanical and thermal treatment of nanopowder phosphor to form a monolithic structure. The resulting nanocomposite scintillator must be suitably transparent, preserve the intrinsic brightness of the nanopowder phosphor, and homogeneously accommodate additives such as wavelength shifting compounds, surfactants, index matching additives, sintering inhibitors, and the like.

Matrix materials useful for preparing embodiment nanocomposite scintillators include those where 1) the refractive index of the matrix is not matched to the refractive index of the nanopowder phosphor; and 2) the refractive index of the matrix is matched to the refractive index of the nanopowder phosphor. Selection of an appropriate phosphor and binder for a nanocomposite scintillator for a particular application is also based on parameters that include, but are not limited to, the mean particle size, particle size distribution, thermal stability, chemical stability and degree and type of agglomeration present in the nanophosphor material. A nanopowder of $Y_2O_3$:Tb (1.0 mol %) with an average primary particle size of 30 nm and the presence of hard agglomerates, for example, requires an index matched binder (i.e. matrix material). By contrast, a nanopowder of $LaBr_3$:Ce (1.0 mol %) in oleic acid dispersion with an average primary particle size of 10 nm would not need an index matched matrix material.

Figure 3:
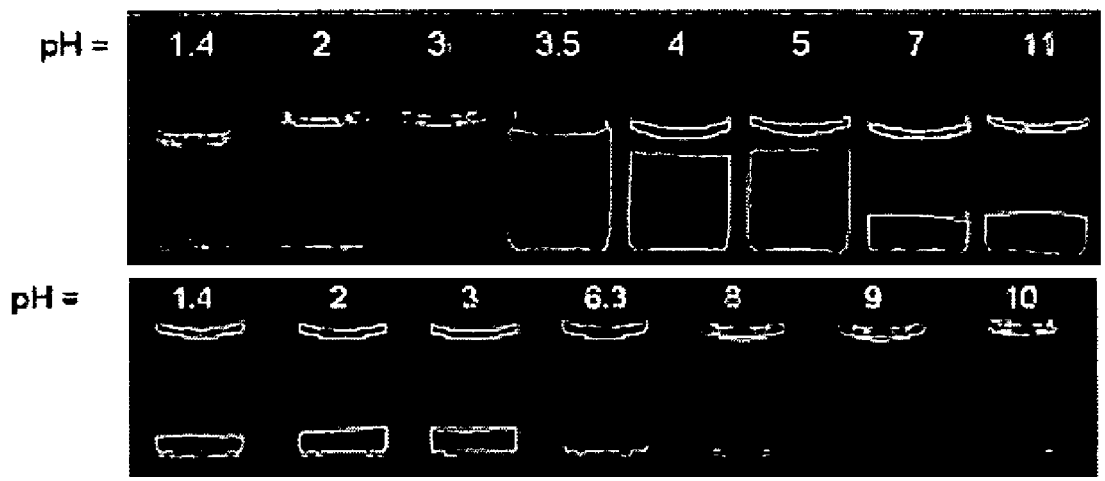
FIG. 3 shows images of several solutions and mixtures prepared using about 1 percent cerium oxide (5 nm size) (upper images). Transparent solutions are obtained below pH=3. The lower images show the effect of the addition of polyacrylic acid, which shifts the transparent region to a higher pH (pH greater than about 7).

Particle agglomeration may be caused by a Van der Waals type- or Coulomb type-attraction between particles. To prevent or at least minimize agglomeration, charge may be added or subtracted from the nanoparticle surface to control dispersion. This may be accomplished, for example, by adjusting the pH of the matrix material [see, for example, Sehgal et al. "Precipitation-Redispersion of Cerium Oxide Nanoparticles with Poly(acrylic acid):Toward Stable Dispersions", Langmuir, volume 21 (2005) pages 9359-9364, incorporated by reference herein). FIG. 3, which is taken from Sehgal et al., shows images of several solutions and mixtures prepared using about 1 percent cerium oxide (5 nm size) (upper images). Transparent solutions are obtained below pH=3; lower). The lower images show the effect of the addition of polyacrylic acid, which shifts transparent region to a higher pH (pH greater than about 7).

Agglomeration may also be prevented or minimized by adding surfactants to the matrix [see, for example, Khan et al. "Interactions of Binders With Dispersant Stabilized Alumina Suspensions", Colloids. Surf. A., vol. 161 (2000) pages 243-257, incorporated by reference herein), or by some other method.

Monodisperse nanopowder phosphor with a particle size less than 20 nm, have a calculated optical attenuation length greater than 1 mm at emission wavelengths of interest, irrespective of the index of refraction of the matrix (i.e. the binder) (see FIG. 1). Preferred nanopowder phosphor properties are a primary particle size of less than about 10 nm, and the ability to make agglomerate free, chemically and physically stable dispersions. Stable dispersions of oxide nanopowders can be made by, for example, careful control of the pH of the dispersing media. For hygroscopic salts like $LaX_3$ where X=Cl, Br, I, the use of surfactant modifiers such as oleic acid in dry solvents such as toluene or dichloromethane will allow stable dispersions to be formed.

Nanoparticles with mean particle sizes below 10 nm of rare earth doped lanthanide oxides, orthosilicates or halides may be prepared using a variety of chemical and physical methods that include, but are not limited to, single source precursor, hydrothermal, spray pyrolysis or solution combustion methods (see, for example, Chander in "Development of Nanophosphors—a Review", Mat. Sci. Eng., volume R 49, (2005) pages 113-155, incorporated by reference herein).

Sequential mechanical processing of micron-sized powder using a process known in the art as bead milling, has also been shown to also produce particles having a size P where $P \leq 20$ nm (see, for example, Kotobuki Industries, "Dispersion of Agglomerated Nanoparticles by Micromedia Mill, Ultra Apex Mill", J. Soc. Powder. Technol. Jap., volume 41, (2004) pages 1-11, incorporated by reference herein). A gradual reduction of the size of the milling media causes a concomitant reduction in the particle size. Milling of the resultant particles in media less than 50 micron diameter in an appropriate medium to prevent agglomeration will result in a dispersion of nanoparticles exhibiting optical transparency.

Some unmatched index matrix materials include, but are not limited to, conventional polymers such as polystyrene (PS), polyvinyl toluene (PVT), polymethylmethacrylate (PMMA) or other material with the appropriate wavelength shifters. The dispersed phosphor nanopowder may be added into the polymer directly, using an appropriate solvent that would preferably swell the polymer and support the dispersion of the nanoparticles, removal of the solvent and air in a vacuum oven would yield a transparent composite. In an embodiment, for example, a nanocomposite scintillator of the invention is prepared by combining about 50 g of solution-combustion-produced, 5-nm average primary particle size $Y_2O_3$:Tb (1.0 mol %) in about 150 ml of toluene with about 5 wt. % oleic acid, and then bead milling the mixture for about 1 hour using the ULTRA APEX MILL using the 30 μm grinding media. About 50 g of polystyrene powder (finely ground), about 0.75 g of p-terphenyl and about 0.015 g of 3-hydroxyflavone are added into this mixture and mechanically stirred and heated to 40 degrees Celsius to slowly remove the toluene. After two days, the resulting gel is poured into two 40 mm×80 mm crystallization dishes and placed into a vacuum oven. The mixture is evacuated to a pressure of below −20 inches of mercury and slowly heated to over 300 degrees Celsius over the course of 8 hrs. The result is a transparent nanocomposite scintillator that contains about 50 weight percent of the nanopowder phosphor.

In another embodiment, a nanocomposite scintillator may be prepared as follows. About fifty grams of YSO:Ce (1.0 mol %) are dispersed in about 100 ml of an alkaline solution, ultrasonically homogenized at 200 W for about 30 min to yield a turbid solution. The slow addition of about 10 g polyacrylic acid, with stirring, is done at about 35 degrees Celsius for about 2 hrs, yielding a transparent solution. The mixture is dried and the recovered powder is redispersed in a volume of about 100 ml of acetone. About 40 g of polystyrene powder (finely ground), about 0.60 g of p-terphenyl and about 0.012 g of 1,4-bis(5-phenyloxazol-2-yl)benzene (POPOP) are added into this mixture and mechanically stirred and heated to a temperature of about 30 degrees Celsius to slowly remove the acetone. After about a day, the resulting gel is poured into two 40 mm×80 mm crystallization dishes and placed into a vacuum oven. The mixture is evacuated to a pressure below about −20 in. Hg, and then slowly heated to a temperature of about 300 degrees Celsius over a period of about 8 hours. The result is a transparent plastic scintillator containing about 50 weight percent of the nanopowder phosphor.

In an embodiment nanocomposite of the invention, a thermosetting polymer can be used as a binder. An example of such a nanocomposite scintillator may be prepared by adding about 60 g of $La_2O_3$:Pb (1.0 mol %) to 120 ml of an alkaline solution and ultrasonically homogenizing at 200 Watts for about 30 min to yield a turbid solution. The slow addition of 12 g polyacrylic acid, with stirring, is done at 35 C for 2 hrs, yielding a transparent solution. The mixture is dried and the recovered powder tumble coated with 1.8 g of an epoxy silane-coupling agent. The resulting powder is mixed with 37 g of EPOTEK 301-2FL Part A (epoxy) and 13 g of EPOTEK 301-2FL Part B (amine) with 0.75 g of p-terphenyl and 0.015 g of 3-hydroxyflavone. The mixture is ultrasonically homogenized at 200 W for 30 min and then placed in a vacuum oven where it is then evacuated below −20 inches of Hg and slowly heated to a temperature of about 100 degrees Celsius over the course of about 2 hours. The material is left at 100 degrees Celsius for about 8 hrs. The resulting transparent plastic scintillator contains approximately 50 weight percent of the nanopowder phosphor.

Alternatively, a dispersed nanophosphor could be mixed into melted polymer that is subsequently injection molded, directly yielding the nanocomposite. For example, 40 g of $LaBr_3$:Ce (1.0 mol %) dried nanopowder is bead milled with 40 g of 0.03 mm polystyrene beads for 2 hrs. Scintillating additives consisting of 0.60 g of p-terphenyl and 0.012 g of POPOP are added into this mixture and mechanically tumbled under flowing dry $N_2$ gas for about 2 hours. The material is charged into an injection molder at a barrel temperature of 245 degrees Celsius and a pressure of 1000 atm and injected into a 90 degree Celsius heated mold of dimension 20 cm×20 cm×3 mm in 1-2 seconds.

The dispersed nanopowder phosphor may also be added into the monomer and the subsequent polymerization reaction could be initiated to form the composite in a process known as gelcasting (see, for example, Tong et al. in "Preparation of Alumina by Aqueous Gelcasting", Ceram. Inter., vol. 30 (2004) pages 2061-2066, incorporated by reference herein). In an embodiment, about 50 g of LSO:Ce (1 mol %) is added to approximately 100 ml of a premixed solution consisting of 20 wt. % deionized water, 10 wt. % DARVAN C (surfactant), 50 wt. % methacrylamide monomer, 20 wt. % of cross-linker. The nanophosphor powder is added stepwise and the mixture is ultrasonically homogenized and then de-aired for 1 hr. to make a 50 percent by volume slurry. About 0.75 g of p-terphenyl, about 0.6 g of ammonium persulfate (polymerization initiator), about 0.015 g of POPOP and about 0.010 g of tetramethylethylene diamine (catalyst) are added into this mixture and vigorously stirred to avoid coagulation. The slurry is then cast into the mold and gelled overnight at a temperature of about 65 degrees Celsius to yield a transparent nanocomposite scintillator that contains approximately 40 wt. % of the nanopowder phosphor.

There may be cases where the conditions specified above can not be completely met due to 1) inability to reduce primary particles size to below 20 nm, 2) inability to find pH/surfactant conditions to completely eliminate agglomerates or flocculates or 3) the presence of hard agglomerates due to thermal processing of nanophosphors via pyrolysis or combustion methods. In these cases, significant advantages of the invention can still be realized if the matrix material can be indexed matched, i.e., $-0.02 \leq n_{nano} - n_{matrix} \leq 0.02$. Since the refractive index of polymers typically does not exceed 1.7 and many of the nanophosphor materials of interest have n>1.8, low-melting glasses are obvious choices for index matching materials.

Chalcogenide glasses can be processed below 1000 degrees Celsius and can have tunable refractive indices, depending on the glass composition and processing [see, for example: Pandey et al. in "Optical bandgap and optical constants in $Se_{0.85}Te_{0.15-x}Pb_x$ thin films", Chalcog. Lett., vol. 2 (2005) pages 39-44, incorporated by reference herein). The processing conditions are compatible with the oxide-, oxy-orthosilicate-, and pyrosilicate-based nanopowder phosphors used with this invention. An embodiment nanocomposite scintillator having a chalcogenide glass matrix may be prepared by mixing about 50 g of 100 nm average particle diameter sol-gel or hydrothermally processed $Ga_xLa_{(1-x)}S_3$ powder with 50 g of dried YSO:Tb (1 mol %) powder. The nanophosphor powder has been previously dispersed in 50 ml deionized water with 5 g CALGON (surfactant) at a pH<4.0, ultrasonically homogenized, filtered, and dried. The powder mixture is poured into glass crystallizing dishes and fired in a tube furnace with flowing Ar gas. The firing temperature is between 780-880 C for 4 hours.

In another embodiment, chalcogenide glasses are prepared in a silica tube under vacuum ($10^{-5}$ mbar). High purity materials (Ge, As, Se, $PbI_2$, Sb, Bi and S) are used for the glass preparation (99.999% purity). Arsenic and selenium present surface oxidation and need to be purified by a thermal treatment before the synthesis, since arsenic oxide and selenium oxide are more volatile than As and Se, respectively. The lead iodide, contaminated with water, is purified in a microwave oven before the synthesis (700 W, during 15 min). After purification, the materials are placed in a silica tube, with the oxide or oxyorthosilicate nanophosphor. Then the tube is sealed and heated to 700-800° C. (depending on the composition) in a rocking furnace. The ampoule is maintained 12 h at this temperature, to reach a good reaction between the different elements and a good homogenization of the melt and dispersion of the nanophosphor powder. The glass is obtained by quenching the melt and annealing the sample near its glass transition temperature ($T_g$), to reduce the mechanical stress produced by cooling. The glass is then cut into disks of 1 mm thickness, which are polished with two parallel sides.

Alternately, lower temperature hybrid glasses may be formed by mixing inorganic halides, oxides, sulfates or carbonates into polystyrene or other plastic scintillators, examples of which are shown in TABLE 1 below.

TABLE 1

| Material | Melting Point (° C.) | Refractive Index |
|---|---|---|
| Calcium sulfate dehydrate, $CaSO_4$—$2H_2O$ | 150 | 1.53 |
| Ammonium sulfate, $(NH_4)_2SO_4$ | 280 | 1.533 |
| Copper (II) sulfate pentahydrate, $CuSO_4$—$5H_2O$ | 110 | 1.543 |
| Magnesium sulfate monohydrate, $MgSO_4$—$H_2O$ | 150 | 1.584 |
| Germanium bromide $GeBr_4$ | 26 | 1.627 |
| Calcium oxalate monohydrate, $CaC_2O_4$—$H_2O$ | 200 | 1.65 |
| Ammonium thiocyanate $NH_4CNS$ | 150 | 1.685 |
| Lithium nitrate $LiNO_3$ | 261 | 1.735 |
| Antimony tribromide $SbBr_3$ | 97 | 1.74 |
| Arsenic (III) oxide, $(As_2O_3)$ | 274 | 1.755 |
| Manganese (II) carbonate, $MnCO_3$ | 200 | 1.816 |
| Mercuric Chloride $HgCl_2$ | 277 | 1.859 |
| Manganese (III) hydroxide, $MnO(OH)$ | 250 | 2.25 |

The addition of these index-matching additives can be done in conjunction with the nanophosphor using the techniques described. For example, 50 g of solution combustion produced 50-nm average primary particle size LSO:Ce (1.0 mol %) in 150 ml of toluene with 5 wt. % oleic acid is bead milled for 1 hr. using the Ultra Apex Mill using the 30 µm grinding media. Afterward, 50 g of polystyrene powder, finely ground, 8.5 g of finely ground arsenic oxide, 0.75 g of p-terphenyl and 0.015 g of POPOP are added into this mixture and mechanically stirred and heated to 40° C. to slowly remove the toluene. After two days, the resulting gel is poured into two 40 mm×80 mm crystallization dishes and placed into a vacuum oven. The mixture is evacuated below about –20 inches of Hg and slowly heated to about 300 degrees Celsius over a period of about 8 hours. The resulting transparent plastic scintillator contains about 45 weight percent of nanopowder phosphor.

As another example, a dispersed nanopowder phosphor could be mixed into melted polymer that was subsequently injection molded, directly yielding the nanocomposite. For example, 40 g of $LaI_3$:Ce (1.0 mol %) and 3 weight percent vinyl silane coupling agent, dried nanopowder is bead milled with 40 g of 0.03 mm polystyrene beads and 6.5 g of antimony iodide powder for 2 hrs. Scintillating additives consisting of 0.60 g of p-terphenyl and 0.012 g of POPOP are added into this mixture and mechanically tumbled under flowing dry $N_2$ gas for 2 hrs. The material is charged into an injection molder at a barrel temperature of 245° C. and a pressure of 1000 atm and injected into a 90° C. heated mold of dimension 20 cm×20 cm×3 mm in 1-2 s.

Additionally, the dispersed nanopowder phosphor could be added into the monomer and the subsequent polymerization reaction could be initiated to form the composite in a gelcasting process (vide supra). For example, a mixture of 50 g of 50 nm average particle diameter YSO:Ce (1 mol %) and 8.5 g of finely ground manganese carbonate is added to approximately 100 ml of a premixed solution consisting of 20 wt. % deionized water, 10 wt. % DARVAN C (surfactant), 50 wt. % methacrylamide monomer, 20 wt. % of cross-linker. The nanophosphor powder is added stepwise and the mixture is ultrasonically homogenized and then degassed for 1 hr. to make a 50 volume percent slurry. About 0.75 g of p-terphenyl, 0.6 g of ammonium persulfate, 0.015 g of POPOP and 0.010 g of tetramethylethylene diamine are added into this mixture and vigorously stirred to avoid coagulation. The slurry is then cast into the mold and gelled at 65° C. overnight to yield a transparent scintillating composite contains approximately 40 wt. % of the nanophosphor.

Pressed monoliths. Hot pressing of ceramics and salts is known in the art, and transparent monoliths have been produced for many materials, including the common scintillator sodium iodide (NaI). In using nanopowder phosphor to prepare a pressed monolith of the invention, a very thin layer of the binder must uniformly coat the nanophosphor. A layer would have a thickness of less than about 20 nanometers. In this case the matrix material, or sintering inhibitor, need not be index matched to the nanopowder phosphor. An embodiment of such a monolith may be prepared by, for example, dispersing about 200 g of $LaBr_3$:Ce (1.0 mol %) powder in about 500 ml of an alkaline solution by ultrasonic homogenization at about 200 Watts for about 30 min to yield a turbid solution. Next, a transparent solution would be prepared by the slow addition to the turbid solution of about 40 grams of polyacrylic acid, with stirring, at a temperature of about 35 degrees Celsius over a six hour period. The mixture is then dried and the recovered powder is isostatically pressed at a pressure of about 180 MPa.

Another approach to inhibit sintering during pressing for nanophosphors is to synthesize the nanophosphor in a core-shell geometry. This approach to nanoparticle synthesis is usually done to protect the nanoparticle surface from chemical quenching of surface luminescence states. In our case the shell properties will be chosen to obviate the need for sintering inhibitors in the core material. A promising example would be $LaBr_3$ core with a KBr shell. The core-shell materials are compatible, as shown by the existence of the $K_2LaBr_5$ scintillator. KBr has a cubic crystal structure and can easily be cold pressed. Cold pressing would eliminate the agglomeration and grain coarsening expected to occur in $LaBr_3$ at elevated processing temperatures.

In cases where there is no intrinsic brightness advantage to the nanophosphor as compared to a bulk crystal of cubic symmetry there may be no need for a matrix material. For example 400 g of $La_2O_3$:Bi or Pb (1.0 mol %) powder with an average particle size of 100 nm may be pressed isostatically at a pressure of about 140 MPa and at a temperature of about 250 degrees Celsius for about 8 hours to obtain a transparent monolith of the invention.

Some of the possible radiation detector configurations include mounting the nanocomposite scintillator directly onto the face of a photomultiplier with optical coupling grease; mounting the nanocomposite scintillator directly onto the face of a photodiode with optical coupling grease; mounting a large area nanocomposite scintillator onto light-pipe material that directs the scintillation light to one or more photomultiplier tubes or photodiodes; and indirect coupling of the scintillation light to fiber optics, which transmits the light to a photodiode, photomultiplier tube or CCD camera. Some of these configurations may be more easily implemented using a nanocomposite scintillator prepared with a flexible binder (polydimethylsiloxane (PDMS) for example).

By selecting the appropriate rare earth dopant, the light emission from the radiation detector can be tailored for either a photomultiplier or a photodiode. X-ray and gamma ray detectors based on photomultipliers, for example, may employ $Lu_2SiO_5$ doped with Ce (i.e. LSO:Ce) because the emission maximum of LSO:Ce occurs near a wavelength of about 420 nanometers, which is close to the maximum response of most photomultipliers. On the other hand, if photodiode (silicon photodiode, for example) detection is desired, YSO:Sm would be more preferable because the maximum emission of LSO:Sm occurs near a wavelength of about 542 nanometers, and thus is better matched to the maximum response for silicon photodiodes, which have a maximum response at about 550 nanometers. For a radiation detector used for neutron detection, an oxyorthosilicate of gadolinium would be employed because gadolinium has the largest known cross section for thermal neutrons; the decay scheme yields conversion electrons that excite the rare earth dopant to produce scintillations. Accordingly, $Gd_2SiO_5$ doped with Ce (i.e. GSO:Ce) would be employed for a photodetector using photomultipliers, while GSO:Sm would be employed for a photodetector using photodiodes. In this example matrix materials or nanophosphor material enhanced with $^6Li$ and or $^{10}B$ would further enhance the performance due to increased energy deposition in the matrix due to enhanced thermal neutron cross sections and large kinetic energy release in the capture reactions. Furthermore, thermalization of fast neutrons can be efficiently performed by the large hydrogenic atomic fraction that is present in many polymers, such as polyethylene.

Nanocomposite scintillators and detectors of the present invention may be used for large-area radiation detection such as portal monitors. There currently is a need for relatively inexpensive detectors for portal monitors related to the need for increased transportation security at airports, seaports, and bus and rail terminals, especially after the September 11 attack on the World Trade Center. The radiation detectors of this invention may be used for these types of monitors. The nanocomposite scintillators may also be used in radiation detectors with complex and irregular shapes.

Embodiment nanopowder phosphors may include rare earth doped oxyorthosilicates. Other materials such as crystalline NaI:Tl, BGO, semiconductors, and noncrystalline organic materials may also be used.

In addition to LSO:Ce LSO:Sm and GSO:Ce, other preferable rare earth doped oxyorthosilicates include LYSO:Ce (see U.S. Pat. No. 6,323,489 to McClellan entitled "Single Crystal Scintillator," which issued on Nov. 27, 2001, incorporated by reference herein, which describes cerium activated oxyorthosilicate scintillator having the having the general formula $Lu_{(2-x-z)}Y_xCe_zSiO_5$, wherein $0.05 \leq x \leq 1.95$ and $0.001 \leq z \leq 0.02$, which is abbreviated as LYSO:Ce), and the rare earth doped oxyorthosilicates described in U.S. Pat. No. 6,689,298 to McClellan et al. entitled "Crystalline Rare-Earth Activated Oxyorthosilicate Phosphor," which issued on Feb. 10, 2004, incorporated by reference herein, which describes a variety of single crystal phosphors such lutetium oxyorthosilicate (LSO), gadolinium oxyorthosilicate (GSO), yttrium oxyorthosilicate (YSO), lutetium yttrium (LYSO) phosphor, lutetium gadolinium (LGSO) phosphor, and gadolinium yttrium (GYSO) phosphor that have been doped with rare earth dopants Sm, Tb, Tm, Eu, Yb, and Pr. These rare-earth doped oxyorthosilicates are preferable due to their tailorable optical emission, high light output and high density. Not only are they bright and dense, they are also fast and therefore can be used in detectors for proton and neutron radiography, for positron emission tomography, and for medical radiography. Current large-area radiographic devices are based on pixelated single crystals. These devices suffer from disadvantages associated with non-uniform light output over the large area of the detector, and from the dark contrast lines that result from the seams between the pixels. By contrast, the nanocomposite scintillators of this invention have a relatively uniform light output and can be made seamless over a large area, thereby providing solutions to the aforementioned existing problems associated with pixelated detectors.

Another significant problem associated with the production of pixelated detectors relates to the difficulty in producing pixels; some materials, such as the known scintillator $Gd_2SiO_5$:Ce (GSO:Ce) single crystals are micaceous and cannot be easily cut into pixels and polished for use in radiographic imaging. Large area detectors of this invention employing a GSO:Ce scintillating powder would not require GSO:Ce single crystal pixels; the bulk GSO:Ce could be ground into powder, mixed with a flexible polymer binder such as PDMS, and pressed to form a large area, seamless composite that can be used for radiation detection of this invention.

In summary, composites of fast, bright and dense rare-earth doped scintillating nanopowder phosphor mixed with a binder are prepared. These nanocomposite scintillators are used with photomultipliers or photodiodes for inexpensive radiation detectors that may be useful in applications related to, but not limited to, Homeland Security, International Safeguards, Scientific Research and Medical Imaging. The nanocomposite scintillators and detectors using them may provide an energy resolution comparable to High Purity Germanium and cost and size comparable to a plastic scintillator.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A nanocomposite scintillator consisting essentially of a mixture of a solid binder and at least one nanopowder phosphor of a lanthanide halide having a formula $CeX_3$ or $LaX_3$:Ce wherein La is selected from lanthanum (La) and yttrium (Y), and wherein X is selected from Cl, Br, and I, and wherein said nanopowder phosphor is an amount greater than about 30 percent by volume.

2. The nanocomposite scintillator of claim 1, wherein said binder is transparent to light emitted by the rare earth doped nanopowder phosphor.

3. The nanocomposite scintillator of claim 1, wherein said binder comprises a polymer or a polymer with an index-matching additive.

4. The nanocomposite scintillator of claim 1, wherein said binder comprises a chalcogenide, flint, or lanthanum flint glass.

5. The nanocomposite scintillator of claim 1, wherein said nanopowder phosphor comprises a first refractive index and the solid binder comprises a second refractive index, and wherein the first refractive index and second refractive index are equal.

6. The compact of claim 1, wherein said nanopowder phosphor comprises a first refractive index $n_{nano}$ and the solid binder comprises a second refractive index $n_{matrix}$, and wherein $-0.02 \leq n_{nano} - n_{matrix} \leq 0.02$.

7. The nanocomposite scintillator of claim 1, wherein the nanopowder phosphor comprises a particle size P, wherein $P \leq 100$ nanometers.

8. The nanocomposite scintillator of claim 1, wherein the nanopowder phosphor comprises a particle size P, wherein $P \leq 20$ nanometers.

9. The nanocomposite scintillator of claim 1, wherein the nanopowder phosphor comprises a particle size P, wherein $P \leq 10$ nanometers.

10. The nanocomposite scintillator of claim 1, wherein the nanopowder phosphor comprises a particle size P, wherein $P \leq 5$ nanometers.

11. The nanocomposite scintillator of claim 1, wherein the amount of nanophosphor in the nanocomposite scintillator is greater than about 35 percent by volume.

12. The nanocomposite scintillator of claim 1, wherein the amount of nanophosphor in the nanocomposite scintillator is greater than about 40 percent by volume.

13. The nanocomposite scintillator of claim 1, wherein the amount of nanophosphor in the nanocomposite scintillator is greater than about 45 percent by volume.

14. The nanocomposite scintillator of claim 1, wherein the amount of nanophosphor in the nanocomposite scintillator is greater than about 50 percent by volume.

15. The nanocomposite scintillator of claim 1, wherein the amount of nanophosphor in the nanocomposite scintillator is greater than about 55 percent by volume.

16. The nanocomposite scintillator of claim 1, wherein the amount of nanophosphor in the nanocomposite scintillator is greater than about 60 percent by volume.

17. A radiation detection method, comprising:
exposing a compact to ionizing radiation, wherein the compact comprises a nanocomposite scintillator consisting essentially of a mixture of a solid binder and a lanthanide halide having a formula $CeX_3$ or $LaX_3$:Ce wherein La is selected from lanthanum (La) and yttrium (Y), and wherein X is selected from Cl, Br, and I wherein the nanopowder phosphor is an amount greater than about 30 percent by volume; and
detecting luminescence from the nanocomposite scintillator.

18. The radiation detection method of claim 17, wherein the amount of nanophosphor in the nanocomposite scintillator is greater than about 35 percent by volume.

19. The radiation detection method of claim 18, wherein the amount of nanophosphor in the nanocomposite scintillator is greater than about 40 percent by volume.

20. The radiation detection method of claim 18, wherein the amount of nanophosphor in the nanocomposite scintillator is greater than about 45 percent by volume.

21. The radiation detection method of claim 18, wherein the amount of nanophosphor in the nanocomposite scintillator is greater than about 50 percent by volume.

22. The radiation detection method of claim 18, wherein the amount of nanophosphor in the nanocomposite scintillator is greater than about 55 percent by volume.

23. The radiation detection method of claim 18, wherein the amount of nanophosphor in the nanocomposite scintillator is greater than about 60 percent by volume.

24. A radiation detector, comprising:
nanocomposite scintillator consisting essentially of a mixture of a solid binder and a lanthanide halide having a formula $CeX_3$ or $LaX_3$:Ce wherein La is selected from lanthanum (La) and yttrium (Y), and wherein X is selected from Cl, Br, and I wherein the nanopowder phosphor is an amount greater than about 30 percent by volume; and
a photodetector optically coupled to said nanocomposite scintillator.

25. The radiation detector of claim 24, wherein said photodetector comprises a photodiode or photomultiplier.

26. The radiation detector of claim 24, wherein the amount of nanophosphor in the nanocomposite scintillator is greater than about 35 percent by volume.

27. The radiation detector of claim 24, wherein the amount of nanophosphor in the nanocomposite scintillator is greater than about 40 percent by volume.

28. The radiation detector of claim 24, wherein the amount of nanophosphor in the nanocomposite scintillator is greater than about 45 percent by volume.

29. The radiation detector of claim 24, wherein the amount of nanophosphor in the nanocomposite scintillator is greater than about 50 percent by volume.

30. The radiation detector of claim 24, wherein the amount of nanophosphor in the nanocomposite scintillator is greater than about 55 percent by volume.

31. The radiation detector of claim 24, wherein the amount of nanophosphor in the nanocomposite scintillator is greater than about 60 percent by volume.

* * * * *